United States Patent [19]

Nishimoto

[11] Patent Number: 5,185,830
[45] Date of Patent: Feb. 9, 1993

[54] OPTICAL WAVEGUIDE DIRECTIONAL COUPLER INCLUDING CONTROL ELECTRODES

[75] Inventor: Hiroshi Nishimoto, Tokyo, Japan

[73] Assignee: NEC Corporation, Tokyo, Japan

[21] Appl. No.: 753,766

[22] Filed: Sep. 3, 1991

[30] Foreign Application Priority Data

Aug. 31, 1990 [JP] Japan .................. 2-228047

[51] Int. Cl.⁵ .................................. G02B 6/10
[52] U.S. Cl. ......................... 385/41; 385/11; 385/14; 385/16; 385/130; 385/131
[58] Field of Search .......... 385/14, 11, 9, 16, 40, 385/41, 42, 130, 131; 356/345

[56] References Cited

U.S. PATENT DOCUMENTS

| | | | |
|---|---|---|---|
| 4,391,486 | 7/1983 | Papuchon et al. | 385/41 |
| 4,711,515 | 12/1987 | Alferness | 385/41 |
| 4,756,588 | 7/1988 | Granestrand | 385/41 |
| 4,772,084 | 9/1988 | Bogert | 385/40 |
| 4,917,449 | 4/1990 | Granestrand | 385/41 |
| 5,066,086 | 11/1991 | Angenent et al. | 385/41 |
| 5,069,517 | 12/1991 | Kersten et al. | 385/41 X |
| 5,101,450 | 3/1992 | Olshansky | 385/40 X |
| 5,111,517 | 5/1992 | Riviere | 385/11 |
| 5,117,471 | 5/1992 | Fürstenau | 385/40 |
| 5,123,069 | 6/1992 | Okayama et al. | 385/40 |

*Primary Examiner*—Brian Healy
*Attorney, Agent, or Firm*—Sughrue, Mion, Zinn, Macpeak & Seas

[57] ABSTRACT

An optical control device such as an optical switch includes two waveguides formed in an electrooptical substrate. Two control electrodes are preferably formed respectively above the two waveguides through a buffer layer. The optical control device is further provided with additional electrodes formed where there is no waveguide therebelow. The additional electrodes are connected with either of the two control electrodes, so that there generates an electric field not only in the direction vertical to the surface of the substrate but in the direction parallel to the surface thereof.

13 Claims, 12 Drawing Sheets

OPTICAL WAVEGUIDE DIRECTIONAL COUPLER INCLUDING CONTROL ELECTRODES

FIELD OF THE INVENTION

This invention relates to an optical control device for modulating a light or changing a light path, and more particularly to, an optical control device including optical waveguides formed in an electro-optical crystal substrate.

BACKGROUND OF THE INVENTION

There has been a great demand for an optical communication system having large capacity and multi-functions, so that it is required in the system that an optical signal is generated to be propagated through optical paths and switched or changed over thereamong in a high speed. In order to obtain an optical signal, there has been realized a direct modulation method in which injection current of a semiconductor laser or a light-emitting diode is modulated method directly. In such a direct modulation, however, there are disadvantages in that high-speed modulation over several GHz is difficult due to effects of relaxation oscillation, it is difficult to realize a coherent optical transmission due to wavelength changes, etc. Therefore, an outer modulation method has been developed in which an optical signal is modulated by an outer optical modulator. In such an optical modulator, a waveguide-type optical modulator including optical waveguides formed in an electro-optical crystal substrate has advantages such as a compact size, a high efficiency and a high-speed operation.

On the other hand, an optical switch is used as means for changing an optical path of an optical signal. A mechanical optical switch has been used in which a prism, a mirror or an optical fiber is moved mechanically to change an optical path of an optical signal. Such a mechanical optical switch has disadvantages of a low-speed operation and a large size which is unable to be adopted for a matrix system. A waveguide-type optical switch has been also developed because of a high-speed operation, a high integration ability, and a high reliability, etc. In such a waveguide-type optical switch, a waveguide-type optical switch using a ferromagnetic material such as lithium niobium oxide ($LiNbO_3$) crystal has several advantages such as low loss because of low optical absorption, a high efficiency because of large electro-optical effects, etc. As a waveguide-type optical switch, an optical control device such as an optical modulator or switch including a directional coupler, a Mach Zehnder-type optical modulator, a balance-bridge type optical modulator or switch, a total reflection-type optical switch has been reported. An optical switch including a directional coupler using a Z-plane $LiNbO_3$ substrate can switch an optical path of an optical signal in any polarizing plane. Such an operation is known as a polarization-independence operation.

The polarization-independence operation can be realized by matching the switching voltage of TE and TM polarized lights which are vertical to each other in an optical signal having a random polarization plane. In other words, applied voltage for obtaining bar-state in a directional coupler in any plane of polarization is the same value.

A conventional optical switch includes an electro-optical crystal substrate consisting of Z-plane $LiNbO_3$ substrate, first and second waveguides of a predetermined length parallel to each other formed in a portion of the substrate in the vicinity of the surface thereof, a buffer layer formed on the substrate covering the surface thereof located the area where the waveguides are formed, and first and second electrodes formed on the buffer layer locating above the first and second waveguides, respectively. In the optical switch, the two waveguides are designed to have the same propagation constant.

In operation, optical signals propagate through the first and second waveguides. An optical signal which propagates through each of the first and second waveguides changes its propagation path to the other waveguide and optical energy is transferred from one waveguide to the other if the directional coupler has the predetermined length. Such a state is known as a cross-state. On the other hand, the optical signal propagates through one waveguide and does not change the path on a predetermined condition. Such a state is known as a bar-state. Such states should be realized independent on polarization of optical signals.

In the cross-state, the complete coupling length of the directional coupler is determined to be the same length between TM and TE polarizations, and there is applied no voltage between the first and second electrodes to generate a Z-axial field, so that 100% of optical energy is transferred from one waveguide to the other. On the other hand, in the bar-state, a voltage is applied between the first and second electrodes, so that the propagation constant becomes different in the first and second waveguides which should have the same propagation constant when there is no voltage applied therebetween.

According to the conventional optical control device, however, there is a disadvantage in that a phase mismatching occurs and the transfer of optical energy becomes difficult, so that the optical signal propagates through one waveguide without changing the path. The switching voltage is defined as a voltage where the bar-state occurs. In addition, the operation voltage for switching or modulating both TM and TE polarized lights simultaneously is required to be high. Therefore, it is difficult to obtain a high cross-talk characteristic, a high distinction ratio, or a low operation voltage.

SUMMARY OF THE INVENTION

Accordingly, it is an object of the invention to provide an optical control device having a high cross-talk characteristic.

It is a further object of the invention to provide an optical control device operating with a low operation voltage.

According to a feature of the invention, an optical control device comprises:

a crystal substrate having an electro-optical effect;

first and second waveguides formed in a part of the substrate in the vicinity of a surface of the substrate, the first and second waveguides being positioned to be proximate to provide an optical directional coupler;

first and second electrodes formed on the first and second waveguides; and third and fourth electrodes formed on the buffer layer respectively located in outside areas of the first and second electrodes;

wherein either one of the first and second electrodes is connected with the third and fourth electrodes for generating electric fields between one of the first and second electrodes being not connected to the third and fourth electrodes and one of the third and fourth electrodes to be applied to one of the first and second waveguides so that the refractive index of TE polarized light is changed.

BRIEF DESCRIPTION OF THE DRAWINGS

The invention will be explained in more detail in conjunction with the appended drawings wherein.

DESCRIPTION OF THE PREFERRED EMBODIMENTS

Before describing an optical control device in the preferred embodiments according to the invention, the conventional optical control device described above will be explained in conjunction with FIGS. 1 to 5.

Figure 1:
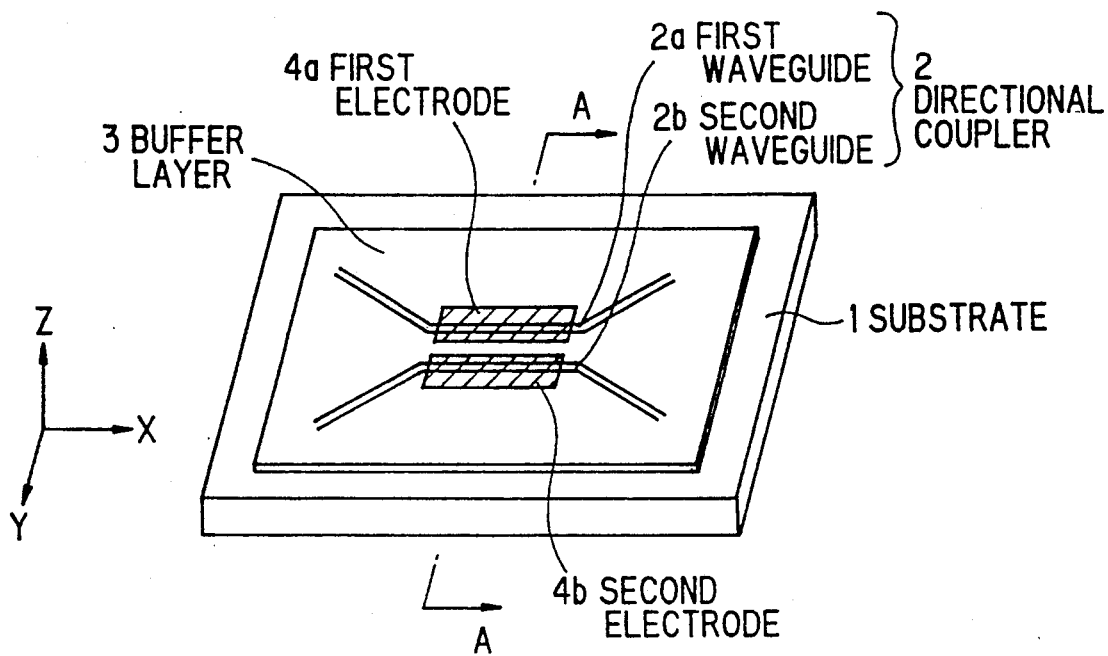
FIG. 1 is a perspective view illustrating a conventional optical switch including a directional coupler.
Figure 2:
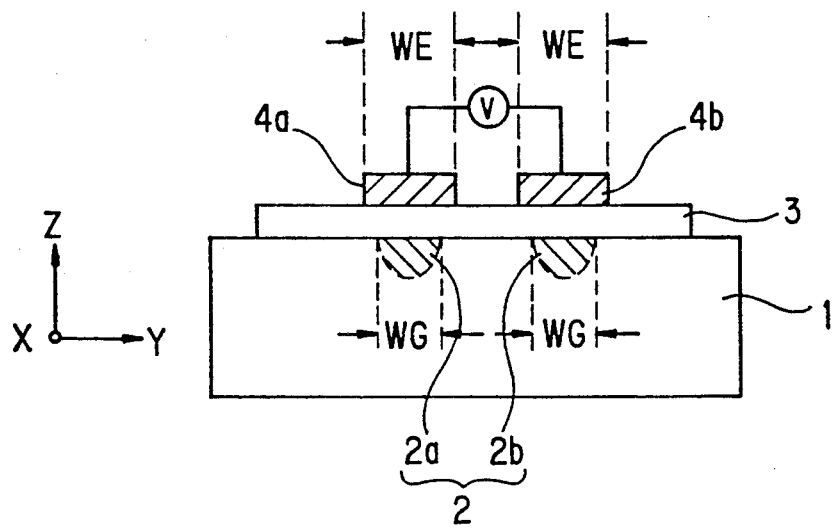
FIG. 2 is a cross-sectional view taken on line A—A of FIG. 1.

FIGS. 1 and 2 show a conventional optical switch including a directional coupler. The optical switch includes an electro-optical crystal substrate (defined as "substrate" hereinafter) 1 consisting of Z-plane LiNbO$_3$ substrate, a directional coupler 2 consisting of first and second waveguides 2a and 2b of a predetermined length parallel to each other formed in a portion of the substrate 1 in the vicinity of the surface thereof, a buffer layer 3 formed on the substrate 1 covering the surface thereof including the area where the waveguides 2a and 2b are formed, and first and second electrodes 4a and 4b of metal formed on the buffer layer 3 locating above the first and second waveguides 2a and 2b, respectively. In the optical switch, the two waveguides 2a and 2b are designed to have the same propagation constant. The buffer layer 3 is for optical buffering to avoid absorption of light by the electrodes 4a and 4b, and consists of a material having a small volume resistivity so that the electrodes 4a and 4b can operate in a high speed. Each of the electrodes 4a and 4b has the width WE which is nearly the same as the width WG of the waveguides 2a and 2b as shown in FIG. 2.

In operation, optical signals propagate through the first and second waveguides 2a and 2b in the direction parallel to an X-axis (defined as "X-axial propagation" hereinafter). An optical signal, which propagates through each of the first and second waveguides 2a and 2b, changes its propagation path to the other waveguide and optical energy translates from one waveguide to the other if the directional coupler 2 has the predetermined length. Such a phenomenon is known as "mode-coupling". In the optical switch, 100% of optical energy is transferred from one waveguide to the other if no voltage is applied to the electrodes 4a and 4b. In this case, the length of the directional coupler 2 is known as "complete coupling-length".

However, the degree of the transfer of optical energy changes by an electric field formed by applying a voltage across the electrodes 4a and 4b, because the refractive index of the substrate 1 in which the waveguides are formed changes. In this case, the optical switch is controlled by a component of the electric field vertical to the surface of the substrate 1; that is, the direction of Z-axis (defined as "Z-axial field" hereinafter). The switching voltage by which the propagation path of optical signals are controlled is determined in accordance with the electro-optical constant in the direction parallel to the Z-axial field (defined as "Z-axial electro-optical constant" hereinafter). The Z-axial electro-optical constant is $r_{33}$ (m/V) in TM polarized light are $r_{13}$ (m/V) in TE polarized light on condition of Z-plane LiNbO$_3$ substrate and X-axial propagation.

As explained before, in the cross-state, the complete coupling length of the directional coupler 2 is determined to be the same length for TM and TE polarizations, and there is applied no voltage between the first and second electrodes 4a and 4b to generate a Z-axial field, so that 100% of optical energy is transferred from one waveguide to the other.

On the other hand, in the bar-state, a voltage is applied between the first and second electrodes 4a and 4b, so that the propagation constant becomes different in the first and second waveguides 2a and 2b, which should have the same propagation constant when there is no voltage applied therebetween. Consequently, a phase mismatching occurs and the transfer of optical energy becomes difficult, so that the optical signal propagates through one waveguide without changing the path. The switching voltage is determined as a voltage where the bar-state occurs.

Figure 3:
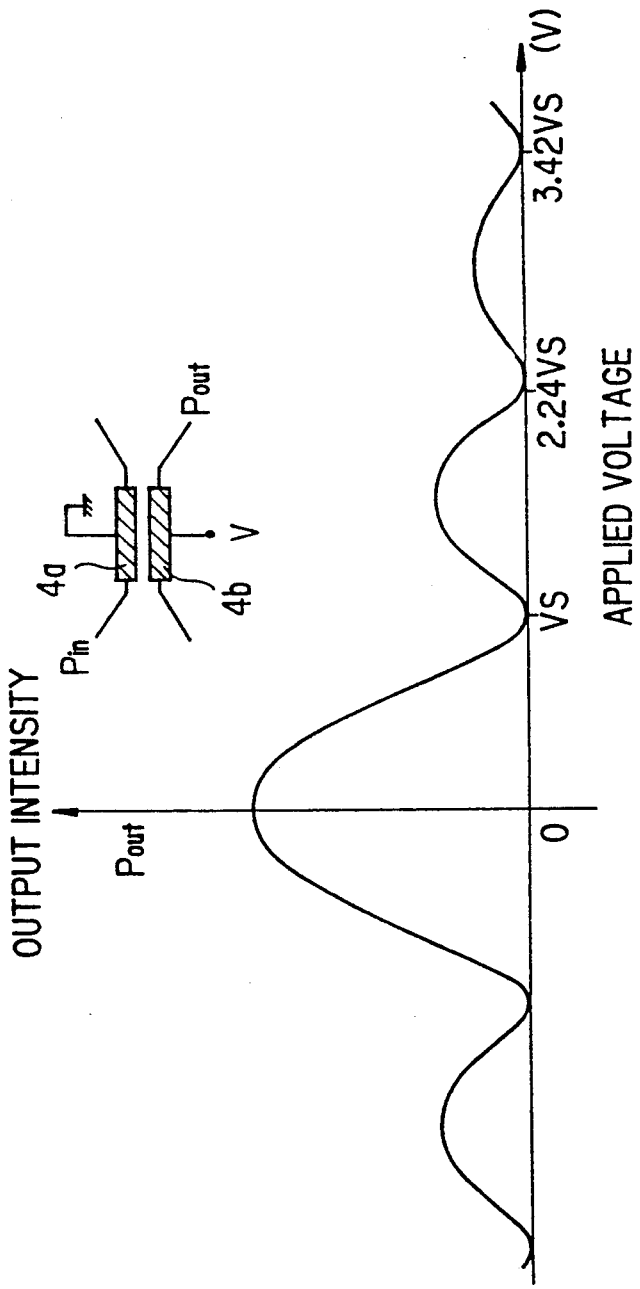
FIG. 3 is a graph of light output intensity in cross-state as a function of applied voltage in the conventional optical switch.

FIG. 3 shows light output intensity in the cross-state as a function of applied voltage in the optical switch. Light output characteristic of the optical switch depends on a material composed of the substrate 1. In FIG. 3, the cross-state corresponds to a state when the cross-output Pout has a maximum value when the applied voltage is "0". On the other hand, the bar-state corresponds to a state when the cross-output Pout is "0". However, such a bar-state is realized by not only a specific voltage in which the complete phase mismatching occurs but several predetermined voltages, that are VS (VS is determined as a minimum voltage in which the bar-state is realized), 2.24 VS, 3.42 VS, etc., for example.

In order to realize a polarization-independent operation, it is required that the switching voltage be the same value in both TM and TE polarized lights. The Z-axial electro-optical constant $r_{33}$ in TM polarized light has a connection with a change of the refractive index $n_e$ of abnormal light, while the Z-axial electro-optical constant $r_{13}$ in TE polarized light has a connection with a change of the refractive index $n_o$. Therefore, in order to obtain a voltage condition in which the bar-state is realized in both TM and TE polarized lights simultaneously, the ratio $r_{33}/r_{13}$ is required to have predetermined values, that are 1.0, 2.24, 3.42, etc., for example. However, in practice, the ratio $R_{33}/r_{13}$ is in the range of approximately 2.9 to 3.4.

It is difficult to adjust the Z-axial electro-optical constant, because the Z-axial electro-optical constant depends on a material of the substrate 1, as explained before. Therefore, it is impossible to realize the complete bar-state in an optical signal having a random plane of polarization. Consequently, cross-talk characteristic may deteriorate in the optical switch which changes an optical path, and distinction ratio may deteriorate in the optical modulator. In addition, the operation voltage for switching or modulating both TM and TE polarized lights simultaneously is required to be high as in the range of 2.9 to 3.4 VS. The operation voltage for switching or modulating only TE polarized light is also required to be high.

Figure 4:
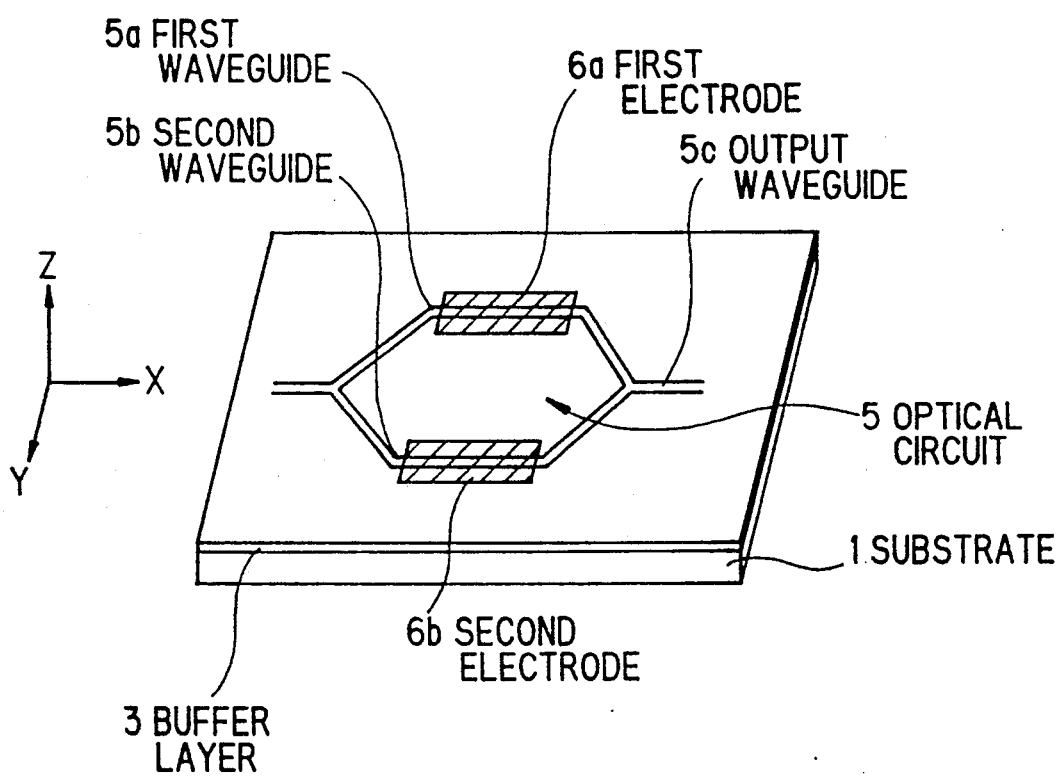
FIG. 4 is a perspective view illustrating a conventional Mach Zehnder-type optical circuit.

FIG. 4 shows a conventional Mach Zehnder-type optical circuit used for optical modulation. The optical circuit includes substrate 1 consisting of Z-plane LiNbO$_3$ substrate, an optical circuit 5 consisting of first and second waveguides 5a and 5b which are joined to an output waveguide 5c formed in a portion of the substrate 1 in the vicinity of the surface thereof, a buffer layer 3 formed on the substrate 1 covering the surface thereof including the area where the waveguides 5a and 5b are formed, and first and second electrodes 6a and 6b of metal formed on the buffer layer 3 locating above the first and second waveguides 5a and 5b, respectively.

Figure 5:
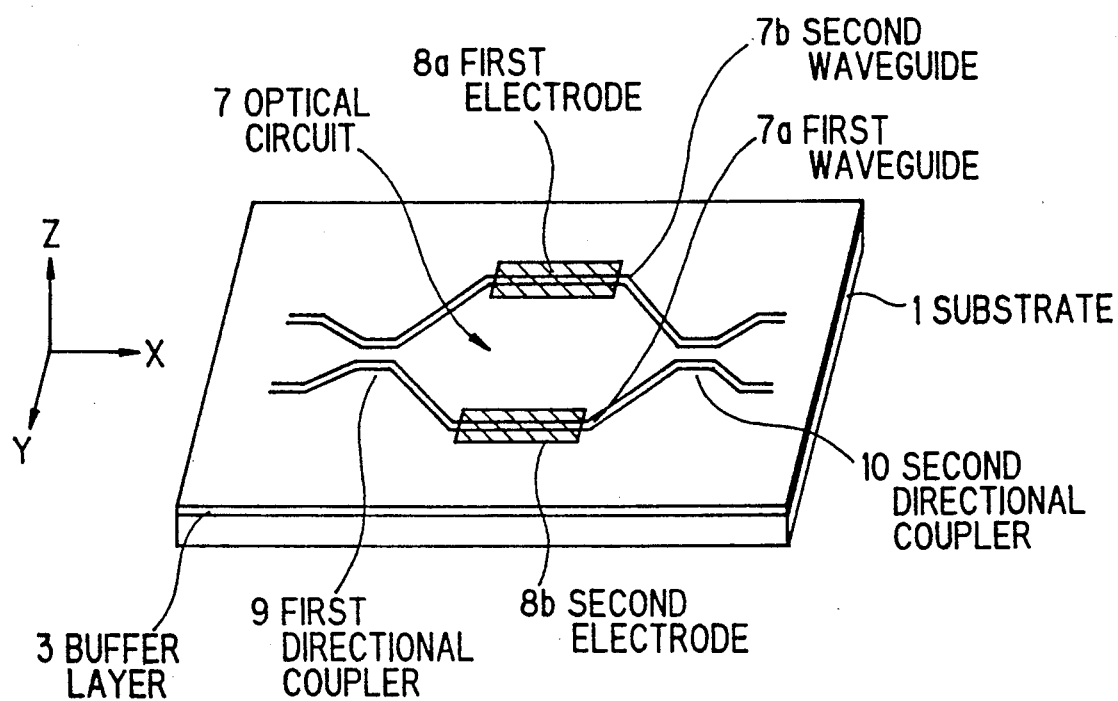
FIG. 5 is a perspective view illustrating a conventional balance bridge-type optical circuit.

FIG. 5 shows a conventional balance-bridge-type optical circuit used for optical switching modulation. The optical circuit includes substrate 1 consisting of Z-plane LiNbO$_3$ substrate, an optical circuit 7 consisting of first and second waveguides 7a and 7b formed in a portion of the substrate 1 in the vicinity of the surface thereof and composing first and second directional couplers 9 and 10, a buffer layer 3 formed on the substrate 1 covering the surface thereof including the area where the waveguides 7a and 7b are formed, and first and second electrodes 8a and 8b of metal formed on the buffer layer 3 locating above the first and second waveguides 7a and 7b, respectively.

These optical circuits operate by using a phase difference between each pair of the two waveguides 5a and 5b or 7a and 7b (FIGS. 4 and 5). In order to realize a polarization-independent operation in these optical circuits, the operation voltage is in the range of 2.9 VS to 3.4 VS in case that the switching voltage or the distinction voltage is defined as VS or TM polarized light. Such a voltage almost corresponds to the operation voltage in TE polarized light. Therefore, it is difficult to obtain a high cross-talk characteristic, a high-distinction ratio, or a low-operation voltage. It is also difficult to obtain a low-operation voltage only in TE polarized light.

Next, an optical switch is preferred embodiments will be explained in conjunction with FIGS. 6 to 14.

Figure 6:
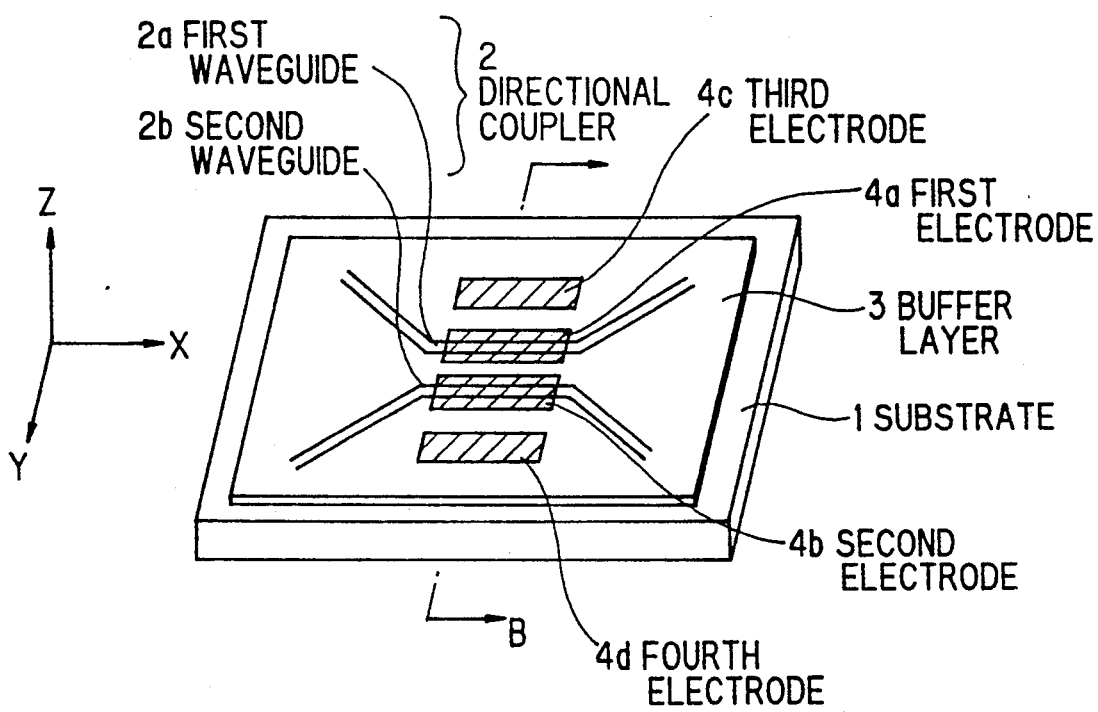
FIG. 6 is a perspective view illustrating an optical switch in a first preferred embodiment according to the invention.
Figure 7A:
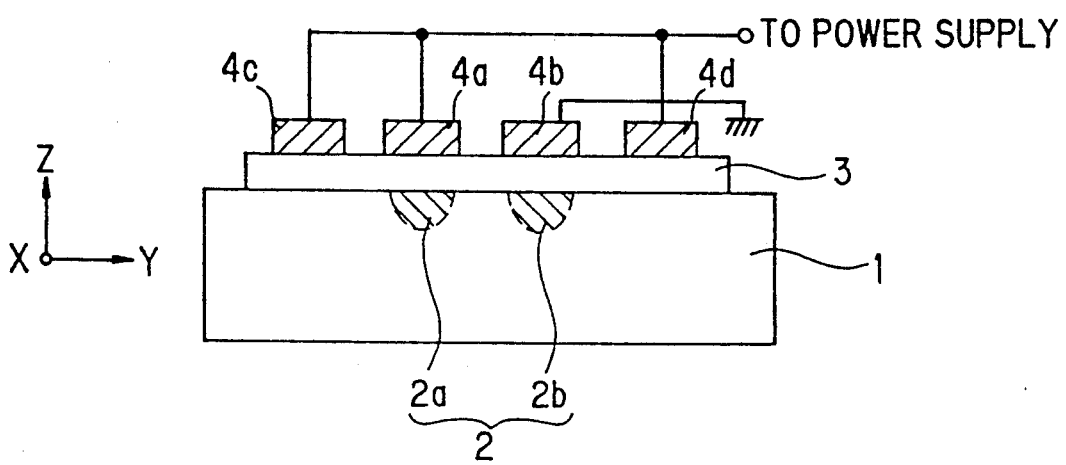
FIGS. 7A and 7B are cross-sectional views taken on line B—B of FIG. 6.
Figure 7B:
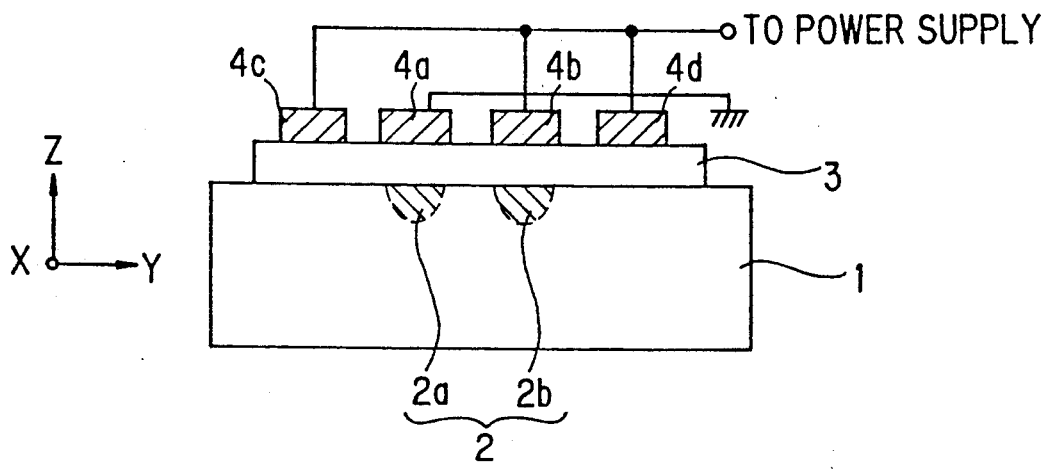

FIGS. 6, 7a and 7b show an optical switch in a first preferred embodiment according to the invention. The basic structure of the optical switch is the same as that of FIGS. 1 and 2, except that the optical switch in the first preferred embodiment is further provided with additional electrodes of third and fourth electrodes 4c and 4d located in outer areas of the buffer layer 3 away from the first and second electrodes 4a and 4b, respectively on the buffer layer 3. The widths WE1 and WE2 of the first and second electrodes 4a and 4b are the same, however, the widths WE3 and WE4 of the third and fourth electrodes 4c and 4d may have any width.

In FIG. 7A, the third and fourth electrodes 4c and 4d are electrically connected with the first electrode 4a by interconnections provided on the surface of the substrate 1 or outer connecting lines to have the same potential.

In operation, there is generated an electric field in the direction of the Y-axis (defined as "Y-axial field" hereinafter) as well as a Z-axial field if a voltage is applied to the electrodes. In this case, the Y-axial field is generated between the second and third electrodes 4b and 4c to be applied to the first waveguide 2a. The electro-optical constant corresponding to the Y-axial field (defined as "Y-axial electro-optical constant" hereinafter) is $r_{22}$, which causes changes of the ordinary light refractive index $n_o$, in other words, which affects only TE polarized light. Therefore, there can be used effects of both Z-axial and Y-axial electro-optical constants if TE polarized light propagates through the waveguide 2a or 2b, so that the ordinary light refractive index can be changed in wider range with the same voltage as that in the conventional optical switch. Consequently, the bar-state can be realized in TM and TE polarized lights simultaneously with a relatively low voltage.

In FIG. 7B, the third and fourth electrodes 4c and 4d are electrically connected with the first electrode 4b.

In operation, the Y-axial field is generated between the first and fourth electrodes 4a and 4d to be applied to the second waveguide 2b. In this case, it is possible to narrow the range of changes of the ordinary light refractive index $n_o$, because the change thereof is cancelled by each other. Therefore, it is possible to adjust the switching voltage in TE polarized light to match the switching voltage therein with that in TM polarized light. Consequently, a high cross-talk characteristic can be obtained in the optical switch changing an optical path and a high extinction ratio can be obtained in an optical intensity modulator in the polarization-independent operation.

In the optical switch, in order to make intensity of the Y-axial field large, the length of the third and fourth electrodes 4c and 4d may be larger, or the gaps between the first and third electrodes 4a and 4c and between the second and fourth electrodes 4b and 4d may be smaller. The third and fourth electrodes 4c and 4d may be formed directly on the surface of the substrate 1 to avoid reduction of the field intensity due to existence of the buffer layer 3. It is determined to select which configurations may be adopted by the switching voltage selected from a group of VS, 2.24 VS, 3.42 VS, etc. The buffer layer 3 may consist of $SiO_2$, $Al_2O_3$, $MgF_2$, SiON, $Si_3N_4$, etc. Each of the electrodes 4a to 4d may consist of Au, Al, Mo, ITO, ZnO, or conductive polymers. The optical switch may not be provided with the buffer layer 3 in condition that there is no optical absorption in the electrodes 4a to 4d.

Figure 8:
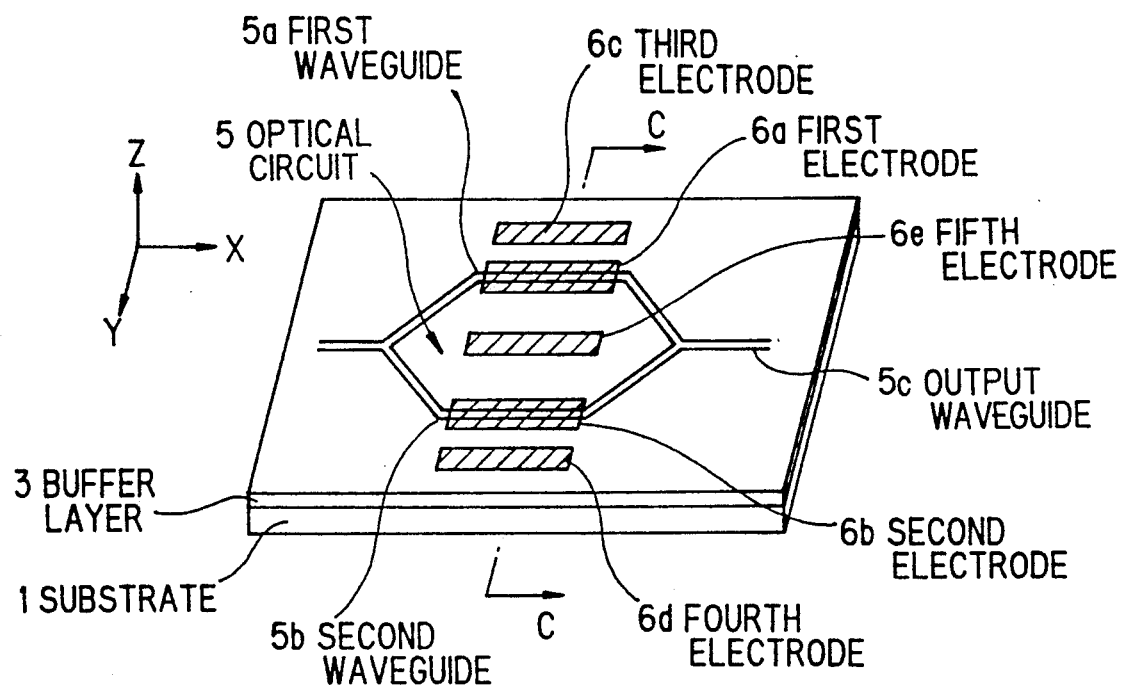
FIG. 8 is a perspective view illustrating a Mach Zehnder-type optical circuit in a second preferred embodiment according to the invention.
Figure 9A:
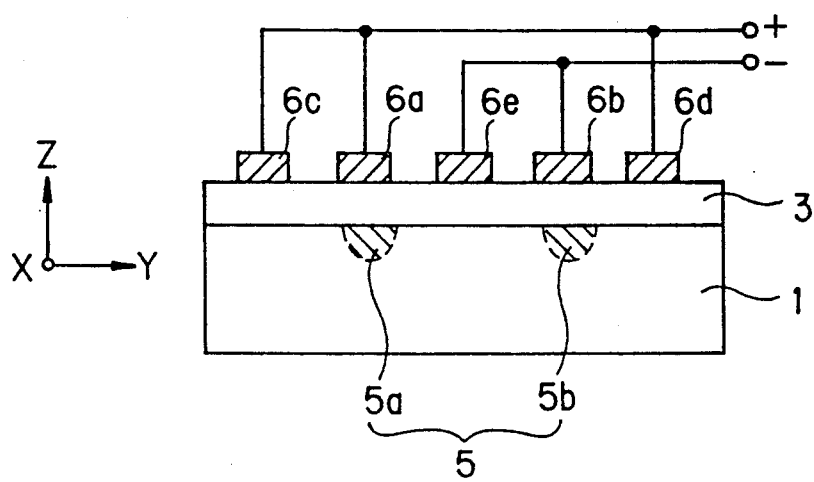
FIGS. 9A and 9B are cross-sectional views taken on line C—C of FIG. 8.
Figure 9B:
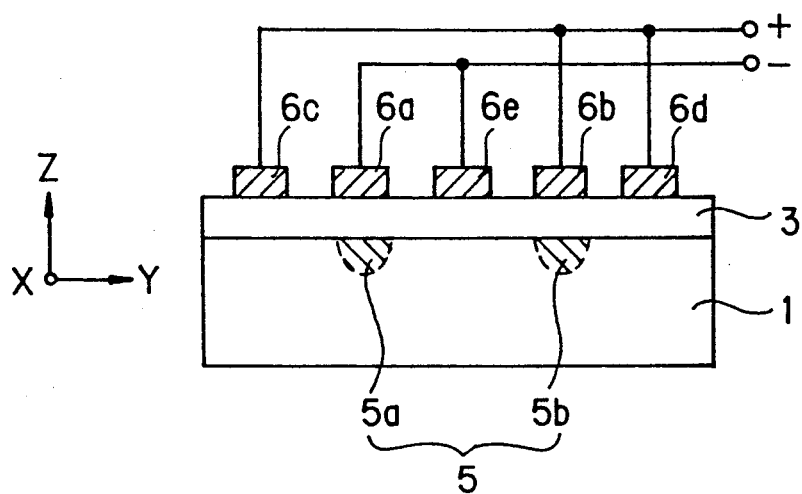

FIGS. 8, 9A and 9B show a Mach Zehnder-type optical circuit in a second preferred embodiment according to the invention. The basic structure of the optical circuit is the same as that of FIG. 4, except that the optical circuit in the second preferred embodiment is further provided with additional electrodes of third and fourth electrodes 6c and 6d in outer areas of the buffer layer 3 away from the first and second electrodes 6a and 6b, respectively, and a fifth electrode 6e located between the first and second electrodes 6a and 6b on the buffer layer 3.

In FIG. 9A, the first, third and fourth electrodes 6a, 6c and 6d are electrically connected with each other to have the positive potential. On the other hand, the second and fifth electrodes 6b and 6e are connected with each other to have ground level or negative potential.

In operation, there are generated Y-axial fields between the third and fifth electrodes 6c and 6e to be applied to the first waveguide 5a and between the fourth and fifth electrode 6d and 6e to be applied to the second waveguide 5b. In this case, Y-axial electro-optical constant is $r_{22}$ which is approximately one fourth of $r_{33}$. The Y-axial fields are applied to the first and second waveguides 5a and 5b in the opposite direction, so that the ordinary light refractive index $n_o$ in one waveguide becomes large, while that in the other waveguide becomes small. Therefore, it is possible to use effects of both Y-axial and Z-axial electro-optical constants in the optical circuit, so that the bar-state can be realized in TM and TE polarized lights simultaneously with a relatively low voltage.

In FIG. 9B, the second, third and fourth electrodes 6b, 6c and 6d are connected with each other to have the positive potential, while the first and fifth electrodes 6a and 6e are connected with each other to have ground level or the negative potential.

In operation, there are generated Y-axial fields between the third and fifth electrodes 6c and 6e to be applied to the first waveguide 5a and between the fourth and fifth electrode 6d and 6e to be applied to the second waveguide 5b. In this case, the Y-axial fields are applied to the first and second waveguides 5a and 5b in the opposite direction as like in FIG. 9A, however, each of the Y-axial field has reversed direction as compared with that in FIG. 9A. Therefore, Y-axial and Z-axial fields are cancelled by each other, so that the switching voltage becomes large. Consequently, it is possible to adjust the switching voltage in TE polarized light to match the switching voltage therein with that in TM polarized light. Consequently, a high cross-talk characteristic can be obtained in the optical switch changing an optical patch and a high extinction ratio can be obtained in an optical intensity modulator in the polarization-independent operation.

Figure 10:
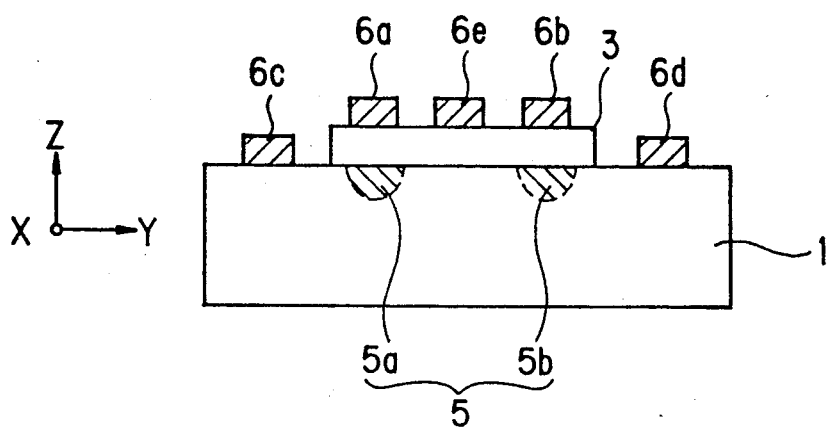
FIG. 10 is a cross-sectional view illustrating a Mach Zehnder-type optical circuit in a third preferred embodiment according to the invention.

FIG. 10 shows a Mach Zehnder-type optical circuit in a third preferred embodiment according to the invention. In this embodiment, the basic structure of the optical circuit is the same as that in FIGS. 8, 9A and 9B, except that third and fourth electrodes 6c and 6d are formed directly on the surface of a substrate 1. There is no waveguide below the third and fourth electrodes 6c and 6d, so that a buffer layer for avoiding optical absorption by electrodes is not required.

Figure 11:
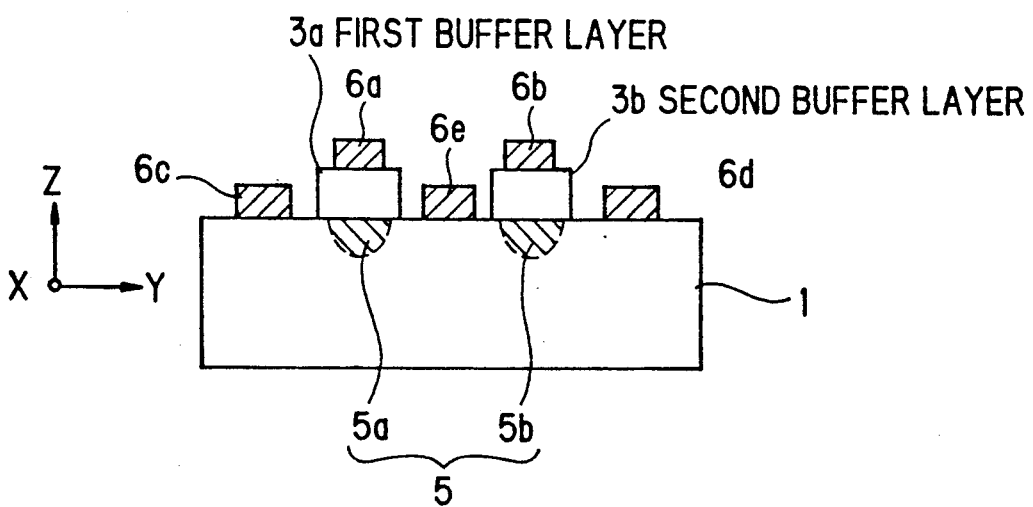
FIG. 11 is a cross-sectional view illustrating a Mach Zehnder type optical circuit in a fourth preferred embodiment according to the invention.

FIG. 11 shows a Mach Zehnder-type optical circuit in a fourth preferred embodiment according to the invention. In this embodiment, the basic structure of the optical circuit is the same as that in FIGS. 8, 9A and 9B, except that third to fifth electrodes 6c to 6e are formed directly on the surface of a substrate 1. There is no waveguide below the third to fifth electrodes 6c to 6e, so that a buffer layer for avoiding optical absorption by electrodes is not required.

In these optical control devices, intensity of the electric field generated in the substrate 1 is affected by existence of the buffer layer 3 due to the small dielectric constant of the buffer layer 3 as compared with that of the substrate 1, so that the electric field has a tendency to concentrate in the buffer layer 3. Therefore, if there is no buffer layer below an electrode, the switching voltage of the optical control device becomes small, that is approximately 60% of that in the optical control device having a buffer layer, so that the switching or modulating voltage in TE polarized light may further reduced. In practice, the optical control device can operate in the range of 1 VS to 2.24 VS on condition that the switching voltage in TM polarized light is VS, though there is required 3.42 VS in the conventional optical control device.

Figure 12:
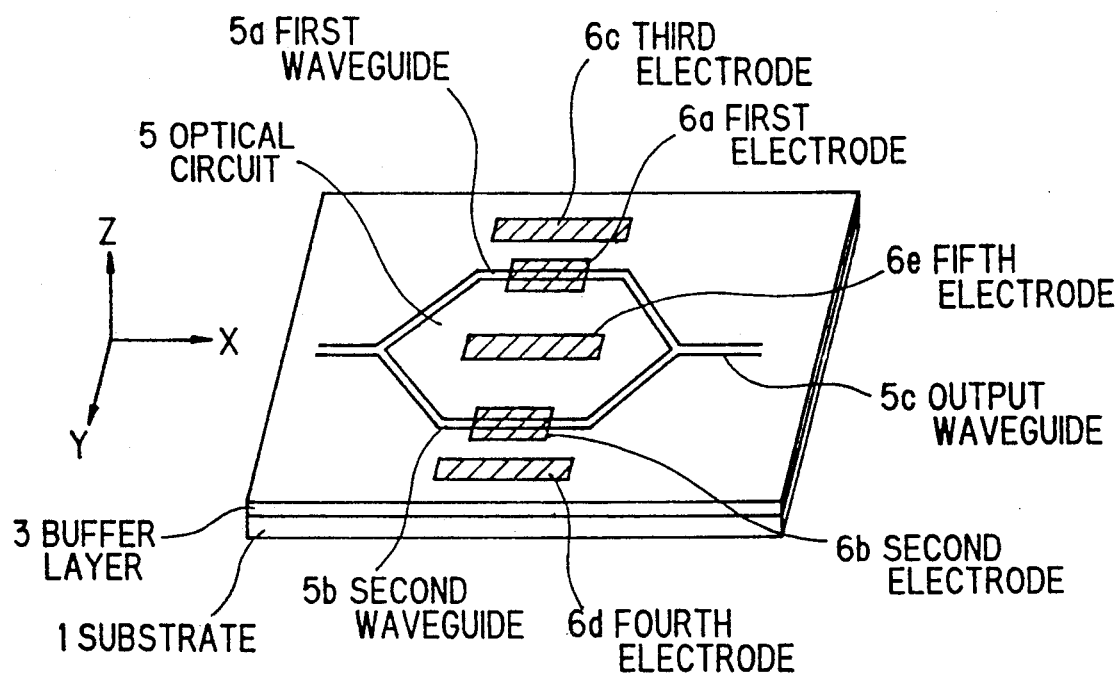
FIG. 12 is a perspective view illustrating a Mach Zehnder-type optical circuit in a fifth preferred embodiment according to the invention.
Figure 13:
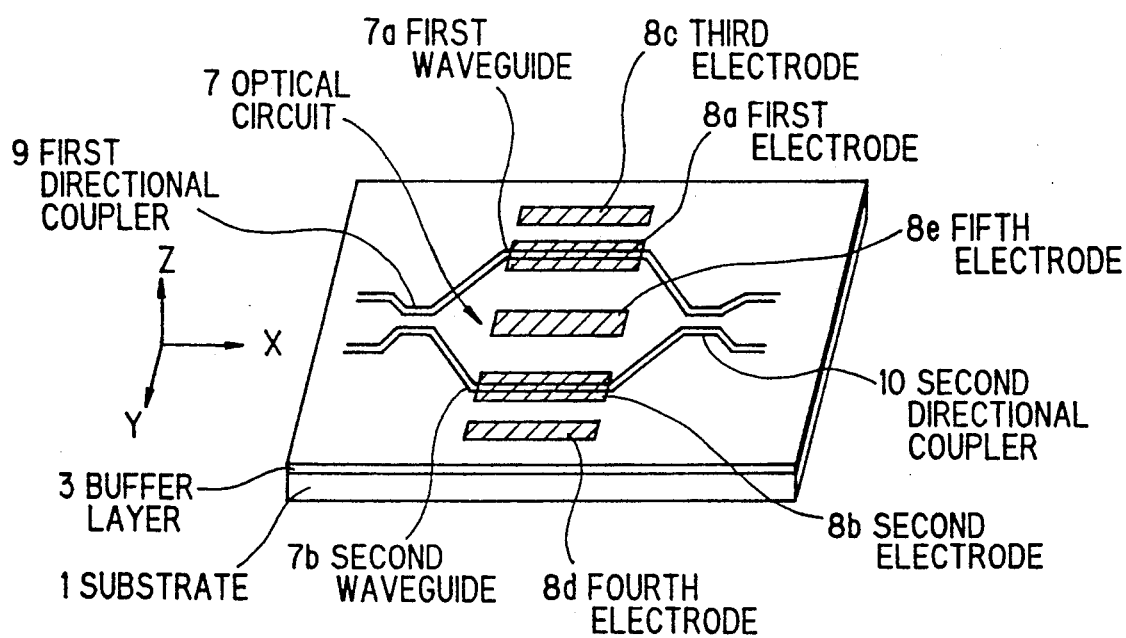
FIG. 13 is a perspective view illustrating a balance bridge-type optical circuit in a sixth preferred embodiment according to the invention.

FIG. 12 shows a Mach Zehnder-type optical circuit in a fifth preferred embodiment according to the invention. In this embodiment, the basic structure of the optical circuit is the same as that in FIG. 8, except that third to fifth electrodes 6c to 6e are longer than first and second electrodes 6a and 6b, so that it is possible to reduce only the switching or modulating voltage in TE polarized light. Therefore, it is easier to match completely the switching characteristic described by a relation of applied voltage and optical output intensity in both TM and TE polarized lights.

FIG., 13 shows a balance-bridge type optical circuit in a sixth preferred embodiment according to the invention. In this embodiment, the basic structure of the optical circuit is the same as that in FIG. 5, except that the optical circuit is further provided with additional electrodes of third and fourth electrodes 8c and 8d in outer areas of the buffer layer 3 away from the first and second electrodes 8a and 8b, respectively and a fifth electrode 8e located between the first and second electrodes 8a and 8b on the buffer layer 3. The effects of having the additional electrodes are the same as those in the second preferred embodiment.

Figure 14:
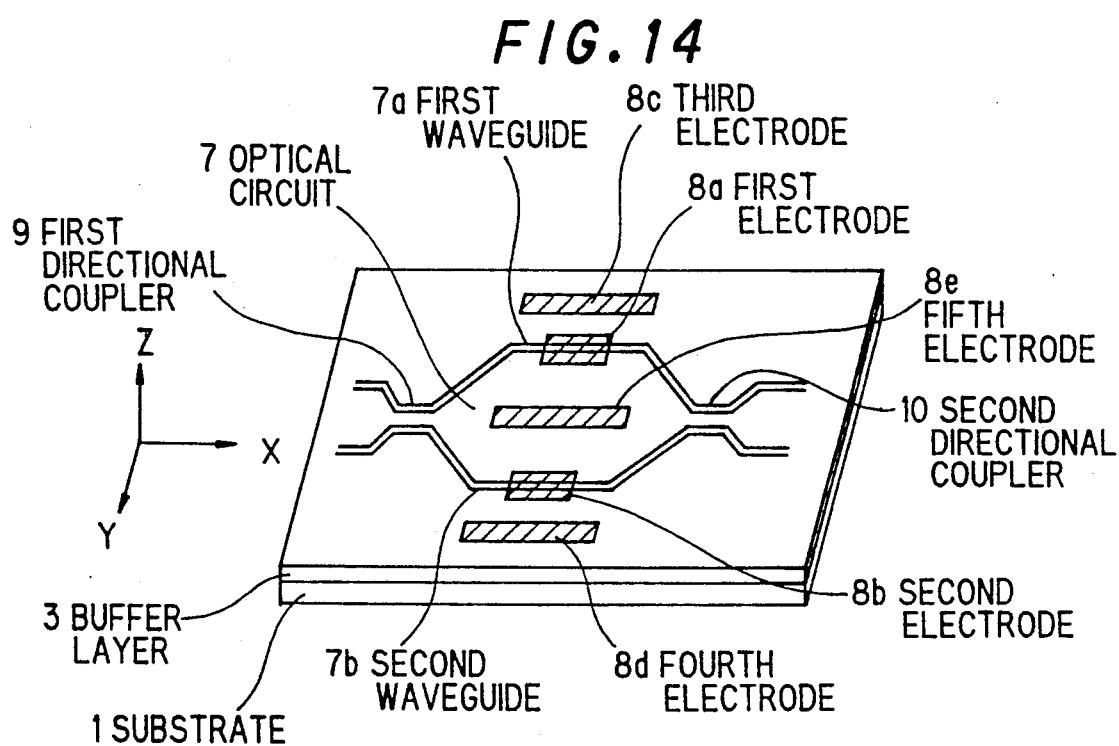
FIG. 14 is a perspective view illustrating a balance bridge-type optical circuit in a seventh preferred embodiment according to the invention.

FIG. 14 shows a balance-bridge type optical circuit in a seventh preferred embodiment according to the invention. In this embodiment, the basic structure of the optical circuit is the same as that in FIG. 13, except that third to fifth electrodes 8c to 8e are longer than first and second electrodes 8a and 8b. The effects of having the electrodes having different lengths are the same as those in the fifth preferred embodiment.

Although the invention has been described with respect to specific embodiment for complete and clear disclosure, the appended claims are not to be thus limited, and it should be noted that alternative constructions that may occur to one skilled in the art may fairly fall within the basic teachings herein set forth.

What is claimed is:

1. An optical control device, comprising:
   a crystal substrate having an electro-optical effect;
   first and second waveguides formed in a part of said substrate in the vicinity of a surface of said substrate, said first and second waveguides being positioned to be proximate said first and second waveguides so as to provide an optical directional coupler;
   first and second electrodes formed on said first and second waveguides; a buffer layer formed on said substrate to cover said surface including an area where said first and second waveguides are formed;

third and fourth electrodes formed on said buffer layer respectively located away from said first and second electrodes;

wherein either one of said first and second electrodes is connected with said third and fourth electrodes for generating electric fields between one of said first and second electrodes being not connected to said third and fourth electrodes and one of said third and fourth electrodes to be applied to one of said first and second waveguides so that the refractive index of TE polarized light is changed; and a fifth electrode formed between said first and second electrodes on said buffer layer; wherein said fifth electrode is connected with either one of said first and second electrodes, said either one of said first and second electrodes being not connected with said third and fourth electrodes.

2. An optical control device, according to claim 1: wherein said third and fourth electrodes are formed directly on said surface of said substrate.

3. An optical control device, according to claim 1: wherein said fifth electrode is formed directly on said surface of said substrate.

4. An optical control device, according to claim 1: wherein said buffer layer consists of a material selected from a group consisting of $SiO_2$, $Al_2O_3$, $MgF_2$, SiON, and $Si_3N_4$.

5. An optical control device, according to claim 1: wherein said electrode consists of a material selected from a group consisting of Au, Al, Mo, ITO, ZnO, and conductive polymer.

6. An optical control device, according to claim 1, further comprising a third waveguide formed in said substrate, said third waveguide joined to said first and second waveguides so as to form a Mach Zehnder-type optical circuit.

7. An optical control device, according to claim 6, wherein said first, third and fourth electrodes are connected with each other and share a positive potential when a voltage is applied to the optical control device.

8. An optical control device according to claim 6, wherein said second, third and fourth electrodes are connected with each other and share a positive potential when a voltage is applied to the optical control device.

9. An optical device, according to claim 6, wherein said third and fourth electrodes are formed directly on said surface of said substrate, and at least said first and second electrodes are formed on said buffer layer.

10. An optical control device, according to claim 9, wherein said fifth electrode is formed directly on said surface of said substrate.

11. An optical control device, according to claim 6, wherein said third, fourth and fifth electrodes are longer than said first and second electrodes.

12. An optical control device, according to claim 6, further comprising at least one directional coupler to said first and second waveguides so as to form a balanced-bridge-type optical circuit.

13. An optical control device, according to claim 12, wherein said third, fourth and fifth electrodes are longer than said first and second electrodes.

* * * * *